United States Patent
Yamauchi

(10) Patent No.: US 8,390,052 B2
(45) Date of Patent: Mar. 5, 2013

(54) NONVOLATILE SEMICONDUCTOR MEMORY DEVICE

(75) Inventor: Yoshimitsu Yamauchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 77 days.

(21) Appl. No.: 12/935,503

(22) PCT Filed: Mar. 31, 2009

(86) PCT No.: PCT/JP2009/056695
§ 371 (c)(1),
(2), (4) Date: Sep. 29, 2010

(87) PCT Pub. No.: WO2009/123203
PCT Pub. Date: Oct. 8, 2009

(65) Prior Publication Data
US 2011/0057242 A1    Mar. 10, 2011

(30) Foreign Application Priority Data

Apr. 2, 2008  (JP) .................... 2008-095679
Nov. 25, 2008  (JP) .................... 2008-299982

(51) Int. Cl.
*H01L 29/788* (2006.01)
*H01L 29/76* (2006.01)
(52) U.S. Cl. .. 257/318; 257/314; 257/316; 257/E29.129
(58) Field of Classification Search .......... 257/315–322, 257/E29.3, E29.129; 365/185.1, 185.26
See application file for complete search history.

(56) References Cited

U.S. PATENT DOCUMENTS

| | | | |
|---|---|---|---|
| 5,313,421 A | 5/1994 | Guterman et al. | |
| 7,333,362 B2 * | 2/2008 | Gendrier et al. | 365/185.01 |
| 7,436,710 B2 * | 10/2008 | Ratnakumar et al. | 365/185.18 |
| 7,623,371 B2 * | 11/2009 | Shiba et al. | 365/185.01 |
| 7,639,536 B2 * | 12/2009 | Shih et al. | 365/185.1 |
| 7,675,106 B2 * | 3/2010 | Bouchakour et al. | 257/315 |
| 7,968,926 B2 * | 6/2011 | Huang et al. | 257/300 |
| 2005/0167728 A1 | 8/2005 | Kothandaraman et al. | |
| 2007/0296020 A1 | 12/2007 | Shiba et al. | |

FOREIGN PATENT DOCUMENTS

| | | |
|---|---|---|
| JP | 8-500937 A | 1/1996 |
| JP | 2862434 B2 | 3/1999 |
| JP | 2005-286185 A | 10/2005 |
| JP | 2007-520067 A | 7/2007 |
| JP | 2008-4718 A | 1/2008 |

* cited by examiner

*Primary Examiner* — Shouxiang Hu
(74) *Attorney, Agent, or Firm* — Birch, Stewart, Kolasch & Birch, LLP

(57) ABSTRACT

A nonvolatile semiconductor memory device having a source-side-injected split-gate type of nonvolatile memory cell which can be formed by a one-layer polysilicon CMOS process is provided. A memory cell includes a first memory cell unit including first and second diffusion regions formed on a semiconductor substrate surface, and first and second gate electrodes separately formed through a gate insulation film on a first channel region between the first and second diffusion regions, a second memory cell unit including third and fourth diffusion regions formed on the semiconductor substrate surface, and a third gate electrode formed through a gate insulation film on a second channel region between the third and fourth diffusion regions, and a control terminal. The first to third gate electrodes are formed of the same electrode material layer. The second and third gate electrodes are electrically connected to form a floating gate capacitively coupled to the control terminal.

8 Claims, 17 Drawing Sheets

| Electrode / Operation Mode | CG | S | SG | D1 | D2 |
|---|---|---|---|---|---|
| Programming | 10V | 0V | 0.8V | 5V | 0 |
| Erasing | 0V | Float | 0 | 10V | 0 |
| Reading | Vcc | 0V | 0 | 0 | 1V |

Fig. 4

Step 1 (Element Isolation Region is formed.)

Step 2 (P-type Well is formed.)

(X1—X1')

(X2—X2')

(X3—X3')

(Y—Y')

Step 3 (N-type Well is formed.)

(X1-X1')

(X2-X2')

(X3-X3')

(Y-Y')

Step 4 (Gate Oxide Film is formed and Gate Electrode Material is deposited.)

(X1—X1')

(X2—X2')

(X3—X3')

(Y—Y')

Step 5 (Gate Electrode is formed.)

Step 6 (N-type Diffusion Region is formed.)

Step 7 (P-type Diffusion Region is formed.)

Step 8 (Contact and Metal Wiring are formed.)

| Electrode / Operation Mode | CG | S | SG | D |
|---|---|---|---|---|
| Programming | 10V | 0V | 0.8V | 5V |
| Erasing | 0V | Float | 0 | 10V |
| Reading | Vcc | 0V | Vcc | 1V |

Fig. 17

NONVOLATILE SEMICONDUCTOR MEMORY DEVICE

CROSS-REFERENCE TO RELATED APPLICATIONS

This application is a National Phase filing under 35 U.S.C. §371 of International Application No. PCT/JP2009/056695 filed on Mar. 31, 2009, and which claims priority to Japanese Patent Applications No. 2008-095679 filed on Apr. 2, 2008 and No. 2008-299982 filed on Nov. 25, 2008.

TECHNICAL FIELD

The present invention relates to a nonvolatile semiconductor memory device, and more particularly to a nonvolatile semiconductor memory device including a source-side injection type of nonvolatile memory cell in which charge injection is performed from a source to a floating gate of a transistor of the memory cell.

BACKGROUND ART

A method for programming a nonvolatile memory cell having a floating gate type of transistor includes a conventional hot electron injection method to inject hot electrons from the high-potential side (drain side) of a programming voltage applied between the drain and source, to a floating gate, and a source-side injection method to inject hot electrons from the low-potential side (source side) to the floating gate. While each of them is the well-known programming method, the source-side injection method has advantages of being high in electron injection efficiency by about three digits, as compared with the conventional hot electron injection method, and of being able to implement high-speed programming.

The nonvolatile memory cell to perform the programming by the source-side injection method has a split-gate structure in which a first gate electrode formed on the source side, and a second gate electrode formed on the drain side are arranged in series in a channel region formed between a pair of source and drain impurity diffusion layers (refer to the following patent document 1, for example).

As shown in FIG. 13, in general, the second gate electrode serving as a floating gate is formed of a first polysilicon layer, an oxide film is deposited thereon, a second polysilicon layer is deposited thereon, and the first gate electrode is formed of it by photolithography. At this time, the first gate electrode and the second gate electrode are overlapped, and a distance between the gate electrodes in a source-drain direction is defined by a film thickness of the oxide film between the first gate electrode and the second gate electrode.
Patent document 1: Japanese Patent No. 2862434

DISCLOSURE OF THE INVENTION

Problems to be Solved by the Invention

When the nonvolatile memory cell using the two polysilicon layers as shown in FIG. 13 and a logic circuit using only one polysilicon layer are consolidated on the same semiconductor substrate, it is necessary to form a second polysilicon layer to form the nonvolatile memory cell, so that production cost of the consolidated device considerably increases. Therefore, it is desired to form the nonvolatile memory cell having the split-gate structure by a standard one-layer polysilicon logic CMOS process. Especially, when a memory cell structure has the second gate electrode formed on a side wall of the first gate electrode (refer to the above patent document 1), a stringer of a conductor remains on a side wall of the second gate electrode, and short circuit could be caused in the second gate electrode between the adjacent memory cells. Therefore, there is a new problem that the process becomes complicated because it is necessary to remove the stringer of the conductor. Furthermore, parasitic capacity between the first gate electrode and the second gate electrode increases, which prevents high-speed access.

However, when the second gate electrode is formed of the same first polysilicon layer used for the first gate electrode instead of being formed on the side wall of the first gate electrode, the distance between the first gate electrode and the second gate electrode in the source-drain direction is not defined by the film thickness of the oxide film between both electrodes, but defined by a minimum processing dimension of the first polysilicon layer, so that it spreads as compared with the case where it is formed on the side wall of the first gate electrode, which makes it difficult to sufficiently ensure a current flowing between the source and drain at the time of reading.

The present invention was made in view of the above problems, and it is an object of the present invention to provide a nonvolatile semiconductor memory device having a source-side-injected split-gate type of nonvolatile memory cell which can be formed by a standard one-layer polysilicon CMOS process.

Means for Solving the Problem

As first characteristics, a nonvolatile semiconductor memory device to attain the above object according to the present invention is characterized by including a nonvolatile memory cell of a split-gate structure having a floating gate, in which the memory cell includes a first memory cell unit including a first diffusion region, a second diffusion region, a first gate electrode adjacent to the first diffusion region, and a second gate electrode adjacent to the second diffusion region, the first diffusion region and the second diffusion region being formed on a surface of a semiconductor substrate, the first gate electrode and the second gate electrode being formed on a first channel region between the first diffusion region and the second diffusion region through a gate insulation film so as to be separated in a separation direction of the first diffusion region and the second diffusion region; a second memory cell unit including a third diffusion region, a fourth diffusion region, and a third gate electrode, the third diffusion region and the fourth diffusion region being formed on the surface of the semiconductor substrate, the third gate electrode being formed on a second channel region between the third diffusion region and the fourth diffusion region through a gate insulation film; and a control terminal, and the first gate electrode, the second gate electrode, and the third gate electrode are formed of the same electrode material layer, and the second gate electrode and the third gate electrode are electrically connected to form a floating gate, and the floating gate is capacitively coupled to the control terminal.

As second characteristics, the nonvolatile semiconductor memory device according to the present invention is characterized in that the second gate electrode and the third gate electrode are integrally formed, in addition to the first characteristics.

As third characteristics, the nonvolatile semiconductor memory device according to the present invention is characterized in that a fourth gate electrode is formed of the electrode material layer on a surface of a second semiconductor substrate through a gate insulation film, the second semiconductor substrate having a conductivity type opposite to that of the semiconductor substrate, or electrically isolated from the semiconductor substrate, the fourth gate electrode is electrically connected to each of the second gate electrode and the third gate electrode, and the second semiconductor substrate is electrically connected to the control terminal, in addition to the first or second characteristics.

As fourth characteristics, the nonvolatile semiconductor memory device according to the present invention is characterized in that the second gate electrode, the third gate electrode, and the fourth gate electrode are integrally formed, in addition to the third characteristics.

As fifth characteristics, the nonvolatile semiconductor memory device according to the present invention is characterized in that the first diffusion region is electrically connected to one of the third diffusion region and the fourth diffusion region, in addition to the any one of the above characteristics.

As sixth characteristics, a nonvolatile semiconductor memory device to attain the above object according to the present invention is characterized by including a nonvolatile memory cell of a split-gate structure having a floating gate, in which the memory cell includes a first memory cell unit including a first diffusion region, a second diffusion region, a first gate electrode adjacent to the first diffusion region, and a second gate electrode adjacent to the second diffusion region, the first diffusion region and the second diffusion region being formed on a surface of a semiconductor substrate, the first gate electrode and the second gate electrode being formed on a first channel region between the first diffusion region and the second diffusion region through a gate insulation film so as to be separated in a separation direction of the first diffusion region and the second diffusion region; and a control terminal formed in a region separated from a region for the first memory cell unit, and the first gate electrode and the second gate electrode are formed of the same electrode material layer, and the second electrode serves as the floating gate and is capacitively coupled to the control terminal.

As seventh characteristics, the nonvolatile semiconductor memory device according to the present invention is characterized in that a fourth gate electrode is formed of the electrode material layer on a surface of a second semiconductor substrate through a gate insulation film, the second semiconductor substrate having a conductivity type opposite to that of the semiconductor substrate, or electrically isolated from the semiconductor substrate, the fourth gate electrode is electrically connected to the second gate electrode, and the second semiconductor substrate is electrically connected to the control terminal, in addition to the sixth characteristics.

As eighth characteristics, the nonvolatile semiconductor memory device according to the present invention is characterized in that the second gate electrode and the fourth gate electrode are integrally formed, in addition to the seventh characteristics.

As ninth characteristics, the nonvolatile semiconductor memory device according to the present invention is characterized in that a fifth diffusion region having the same conductivity type as that of the semiconductor substrate is formed in the first channel region on the surface of the semiconductor substrate between the first gate electrode and the second gate electrode, in addition to any one of the first to eighth characteristics.

Effects of the Invention

With the nonvolatile semiconductor memory device having the first to fifth characteristics, the source-side-injected split-gate type of nonvolatile memory cell in which the first gate electrode serves as a subsidiary gate, the second electrode and the third electrode serve as the floating gate, the control terminal serves as a control gate, the first diffusion region serves as a source at the time of programming, the second diffusion region serves as a drain at the time of programming, and the third diffusion region and the fourth diffusion region serve as one and the other of the source and drain at the time of reading, can be formed by the one-layer polysilicon process. In addition, since the above memory cell can be formed by the one-layer polysilicon process, a combined semiconductor device in which the nonvolatile semiconductor memory device and the logic circuit are consolidated on the same semiconductor substrate can be easily implemented by a normal logic production process.

In addition, the first memory cell unit is used for charge (hot electron) injection to the floating gate at the time of programming operation, and the second memory cell unit is used for a reading operation, respectively, so that even when the distance between the first gate electrode and the second gate electrode is large, a reduction in reading current does not become a problem, so that the reading current can be ensured in the second memory cell unit.

The first gate electrode and the second gate electrode can be formed of the same electrode material layer (first polysilicon layer), which solves the problem that the stringer of the conductor remains on the side wall of the second gate electrode in the above conventional technique.

Especially, with the nonvolatile semiconductor memory device having the second characteristics, the electric connection between the second gate electrode and the third gate electrode can be implemented without using another wiring layer, so that the first memory cell unit and the second memory cell unit can be closely formed, which reduces an occupied area of the memory cell on the semiconductor substrate, and reduces the production cost when the many memory cells are provided.

Furthermore, with the nonvolatile semiconductor memory device having the third characteristics, the fourth gate electrode can be formed of the same electrode material layer used for forming the first, second, and third gate electrodes, so that the capacitor to capacitively couple the control terminal and floating gate can be formed by the standard CMOS process without using another conductor layer.

Furthermore, with the nonvolatile semiconductor memory device having the fourth characteristics, the electric connection between the second gate electrode, the third gate electrode, and the fourth gate electrode can be implemented without using another wiring layer, so that the capacitor to capacitively couple the first memory cell unit, the second memory cell unit, the control terminal, and the floating gate can be closely formed, which reduces the occupied area of the memory cell on the semiconductor substrate, and reduces the production cost when the many memory cells are provided.

Furthermore, with the nonvolatile semiconductor memory device having the fifth characteristics, a source can be shared by the first memory cell unit used for the programming operation and the second memory cell unit used for the reading operation, so that the supply of the source potential to the memory cell can be simplified.

Furthermore, with the nonvolatile semiconductor memory device having the sixth to eighth characteristics, the source-side-injected split-gate type of nonvolatile memory cell in which the first gate electrode serves as a subsidiary gate, the second electrode serves as the floating gate, the control terminal serves as a control gate, the first diffusion region serves as the source at the time of programming and reading, and the second diffusion region serves as the drain at the time of programming and reading can be formed by the one-layer polysilicon process. In addition, since the above memory cell can be formed by the one-layer polysilicon process, a combined semiconductor device in which the nonvolatile semiconductor memory device and the logic circuit are consolidated on the same semiconductor substrate can be easily implemented by a normal logic production process.

In addition, the parasitic capacity between the first gate and the second gate can be reduced, which is suitable for the high-speed access.

In addition, since the first gate electrode and the second gate electrode can be formed of the same electrode material layer (first polysilicon layer), which solves the problem that the stringer of the conductor remains on the side wall of the second gate electrode.

Furthermore, with the nonvolatile semiconductor memory device having the seventh characteristics, the fourth gate electrode can be formed of the same electrode material layer used for forming the first and second gate electrodes, so that the capacitor to capacitively couple the control terminal and floating gate can be formed by the standard CMOS process without using another conductor layer.

Furthermore, with the nonvolatile semiconductor memory device having the eighth characteristics, the electric connection between the second gate electrode and the fourth gate electrode can be implemented without using another wiring layer, so that the capacitor to capacitively couple the first memory cell unit, the control terminal, and the floating gate can be closely formed, which reduces the occupied area of the memory cell on the semiconductor substrate, and reduces the production cost when many memory cells are provided.

Furthermore, with the nonvolatile semiconductor memory device having the ninth characteristics, the diffusion region having the same conductivity type as that of the semiconductor substrate is formed on the surface of the semiconductor substrate between the first gate electrode and the second gate electrode between the source region and the drain region, so that programming efficiency is prevented from being lowered due to the miniaturization of the space between the gates.

BRIEF DESCRIPTION OF THE DRAWINGS

FIG. 4 is a list showing voltage application conditions of operations such as programming, erasing, and reading of the memory cell used in the nonvolatile semiconductor memory device according to the present invention.

FIG. 17 is a list showing voltage application conditions of operations such as programming, erasing, and reading of the memory cell used in the nonvolatile semiconductor memory device according to the present invention.

EXPLANATION OF REFERENCES

1: P-TYPE SEMICONDUCTOR SUBSTRATE (P-TYPE WELL)
2: SOURCE REGION (FIRST DIFFUSION REGION)
3: DRAIN REGION (SECOND DIFFUSION REGION)
4: FIRST CHANNEL REGION
5: GATE OXIDE FILM (GATE INSULATION FILM)
6: FIRST GATE ELECTRODE
7: SECOND GATE ELECTRODE
8: SOURCE REGION (THIRD DIFFUSION REGION)
9: DRAIN REGION (FOURTH DIFFUSION REGION)
10: SECOND CHANNEL REGION
11: THIRD GATE ELECTRODE
12: N-TYPE WELL (SECOND SEMICONDUCTOR SUBSTRATE)
13: FOURTH GATE ELECTRODE
14: CONTACT REGION
15: ELEMENT ISOLATION REGION
16: INTERLAYER INSULATION FILM
17 to 22: CONTACT MATERIAL
24 to 28: METAL ELECTRODE
30: SEMICONDUCTOR SUBSTRATE
31, 32, 34, 35: RESIST PATTERN
33: POLYSILICON FILM
CG: CONTROL GATE
FG: FLOATING GATE
SG: SUBSIDIARY GATE

D1: DRAIN ELECTRODE AT THE TIME OF PROGRAMMING/ERASING OPERATION
D2: DRAIN ELECTRODE AT THE TIME OF READING OPERATION
S: SOURCE ELECTRODE
U1: FIRST MEMORY CELL UNIT
U2: SECOND MEMORY CELL UNIT
U3: THIRD MEMORY CELL UNIT

BEST MODE FOR CARRYING OUT THE INVENTION

First Embodiment

Figure 1:
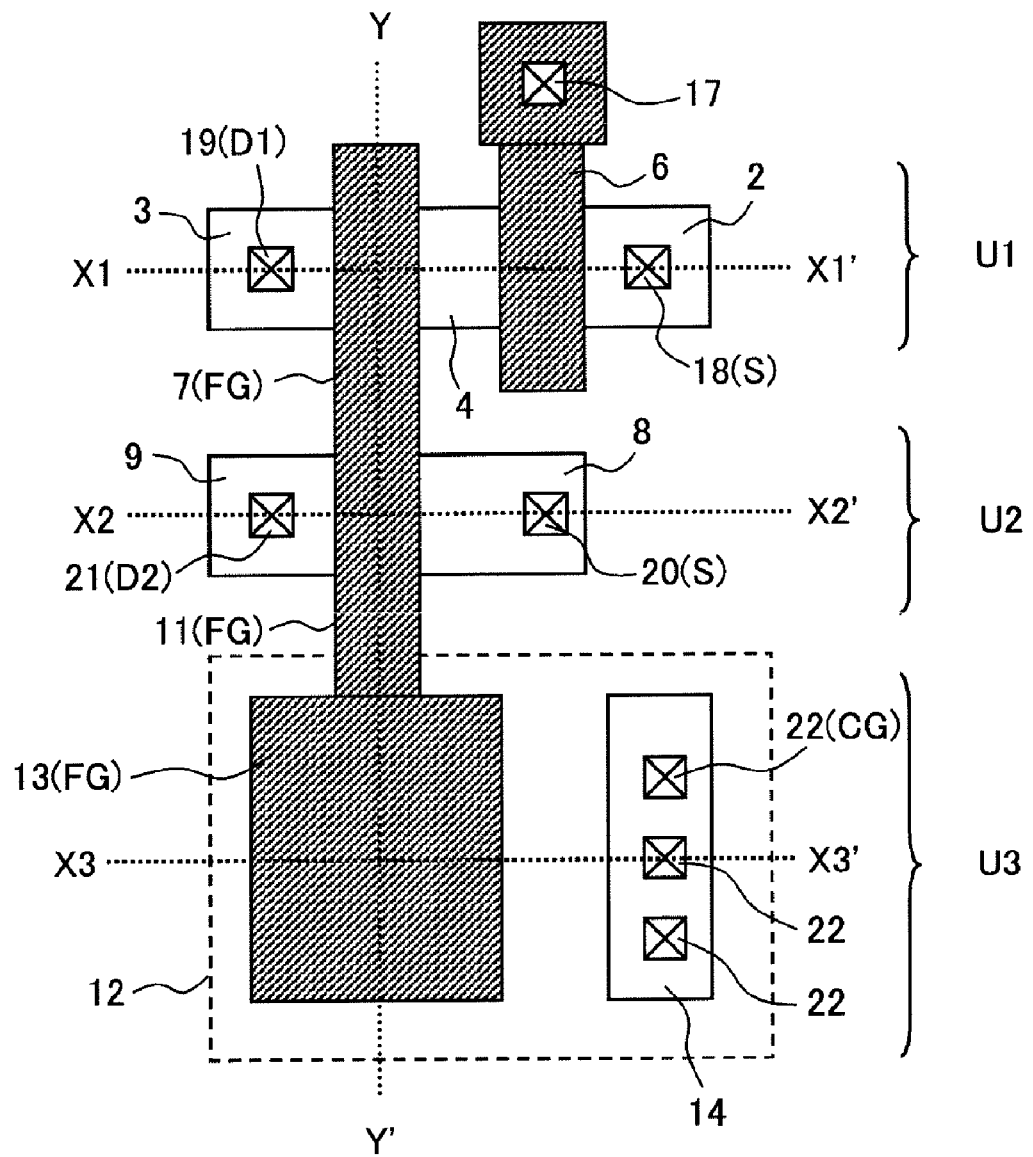
FIG. 1 is a plan view schematically showing a planar structure of a memory cell used in a nonvolatile semiconductor memory device according to the present invention.
Figure 2A:
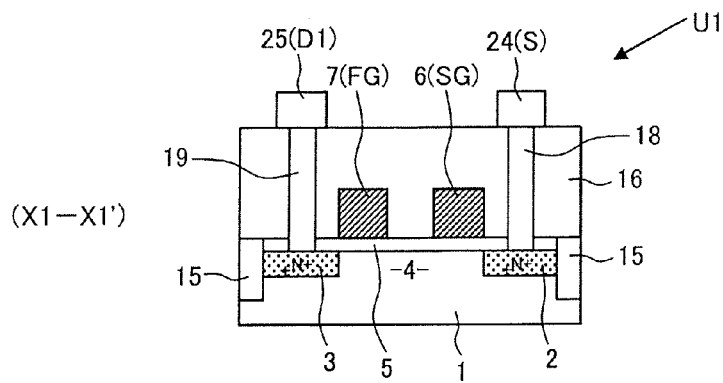
FIG. 2 is a cross-sectional view schematically showing a cross-sectional structure of the memory cell used in the nonvolatile semiconductor memory device according to the present invention.
Figure 2B:
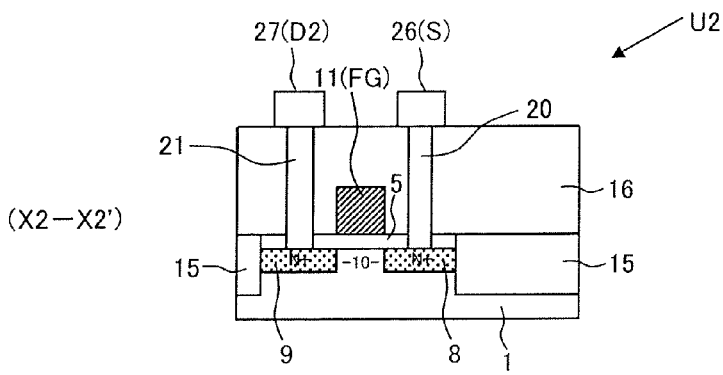
Figure 2C:
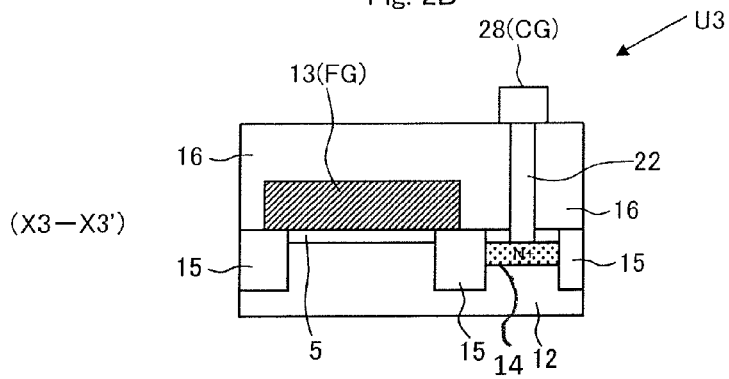
Figure 2D:
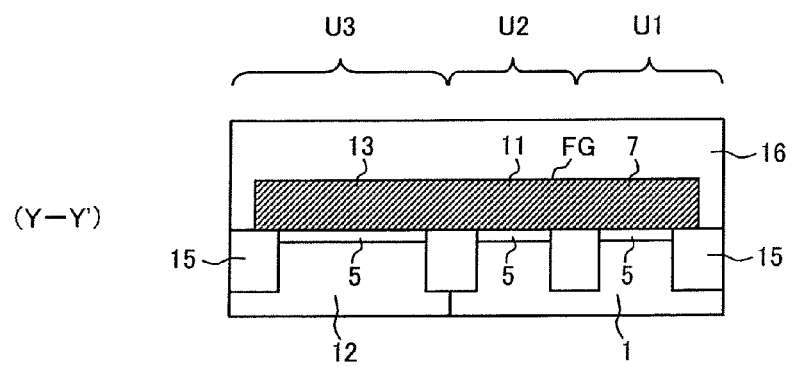
Figure 3:
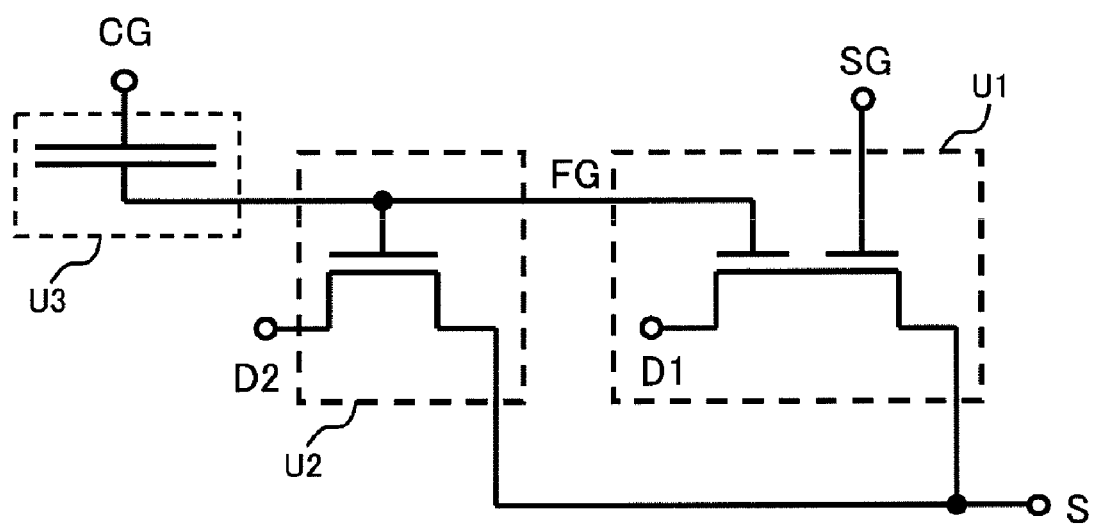
FIG. 3 is an equivalent circuit diagram of the memory cell used in the nonvolatile semiconductor memory device according to the present invention.
Figure 5A:
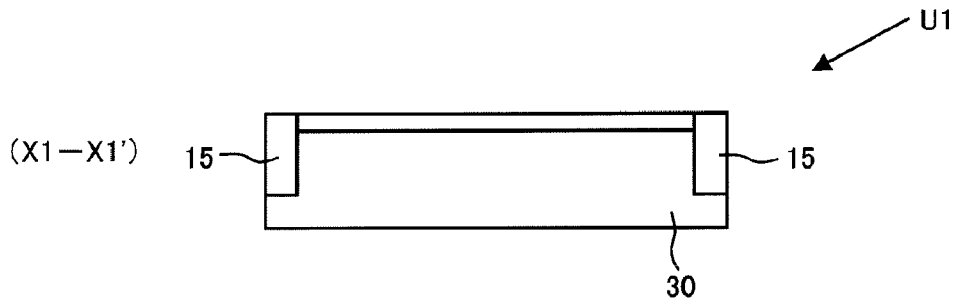
FIG. 5 is a process cross-sectional view schematically showing a cross-sectional structure in a step 1 of a method for producing the memory cell used in the nonvolatile semiconductor memory device according to the present invention.
Figure 5B:
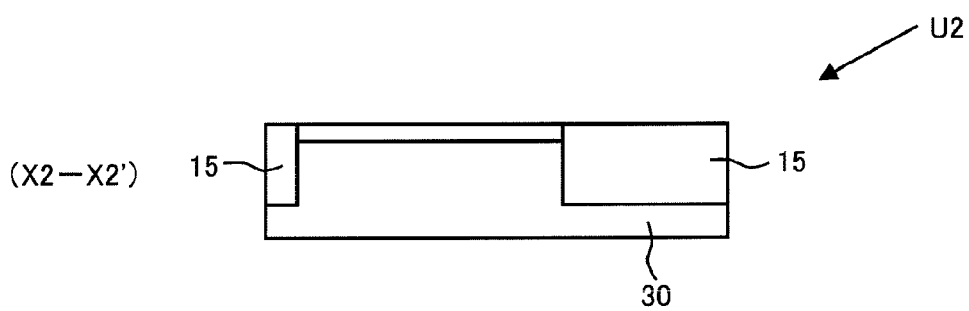
Figure 5C:
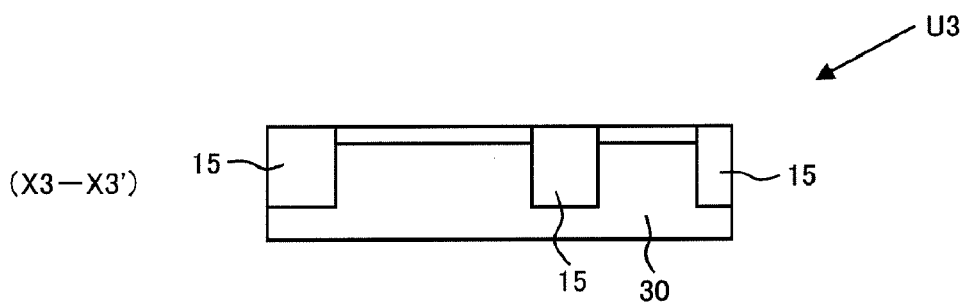
Figure 5D:
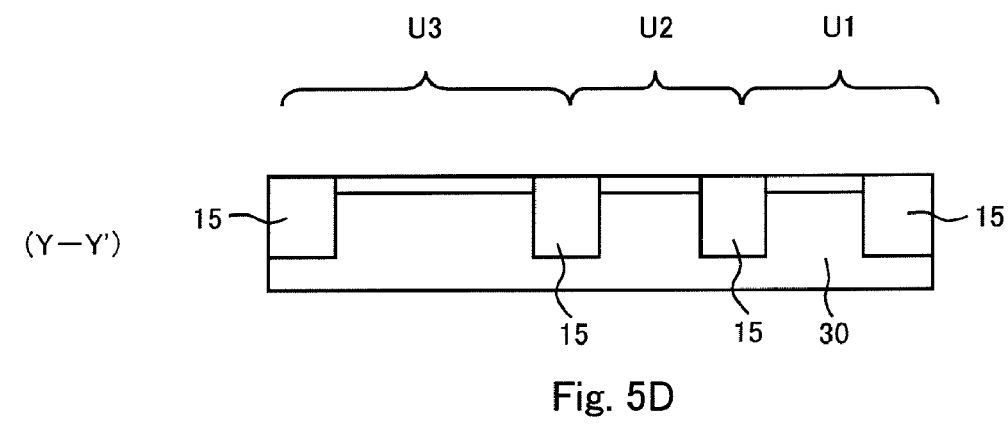
Figure 6A:
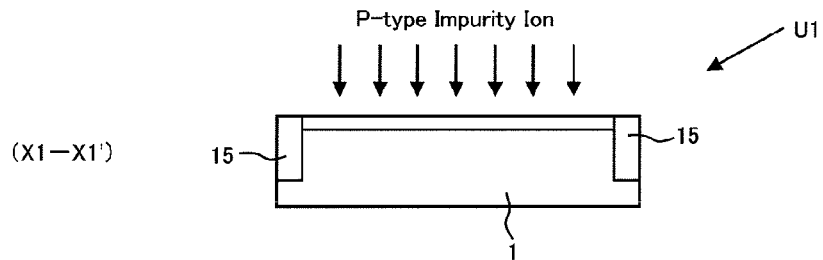
FIG. 6 is a process cross-sectional view schematically showing a cross-sectional structure in a step 2 of a method for producing the memory cell used in the nonvolatile semiconductor memory device according to the present invention.
Figure 6B:
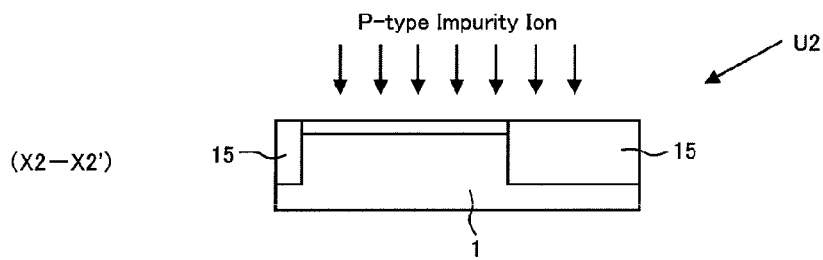
Figure 6C:
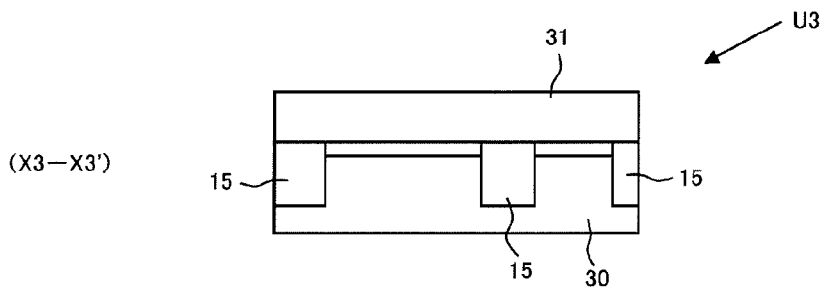
Figure 6D:
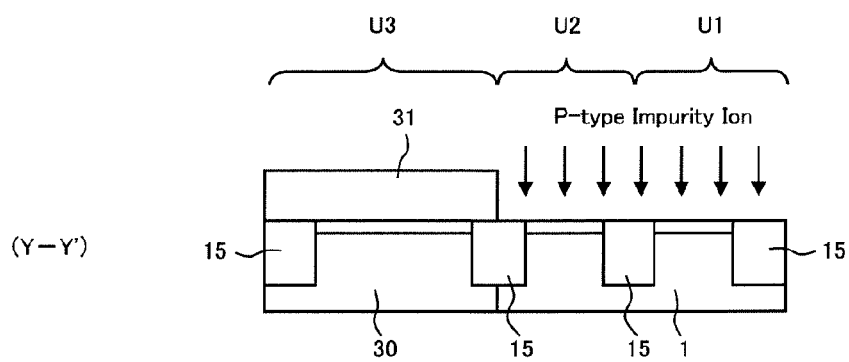
Figure 7A:
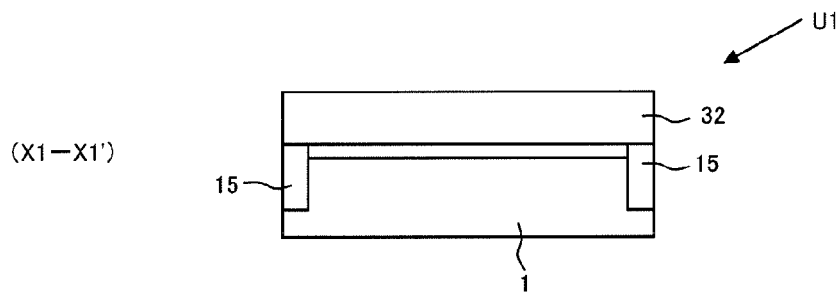
FIG. 7 is a process cross-sectional view schematically showing a cross-sectional structure in a step 3 of a method for producing the memory cell used in the nonvolatile semiconductor memory device according to the present invention.
Figure 7B:
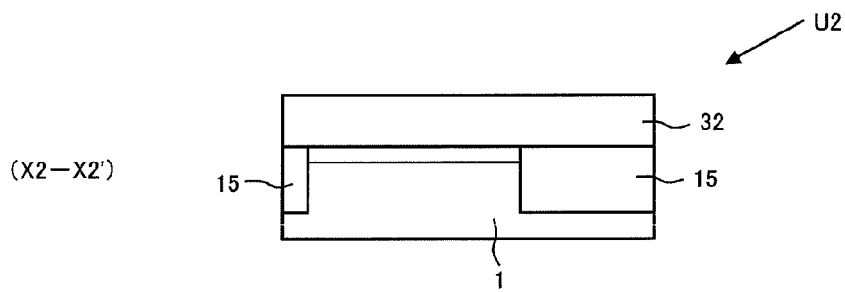
Figure 7C:
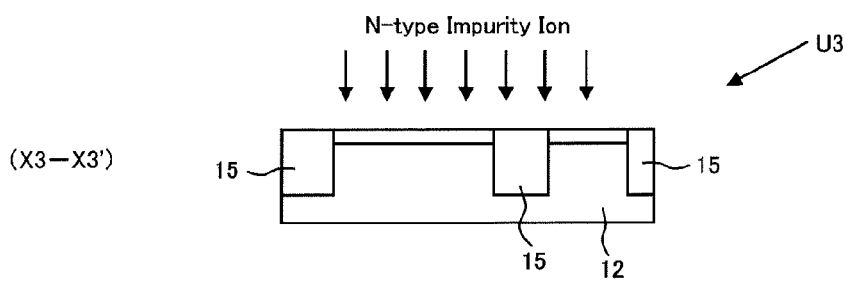
Figure 7D:
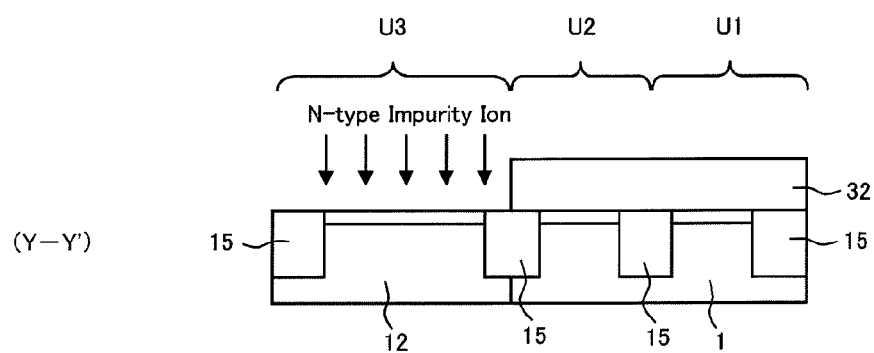
Figure 8A:
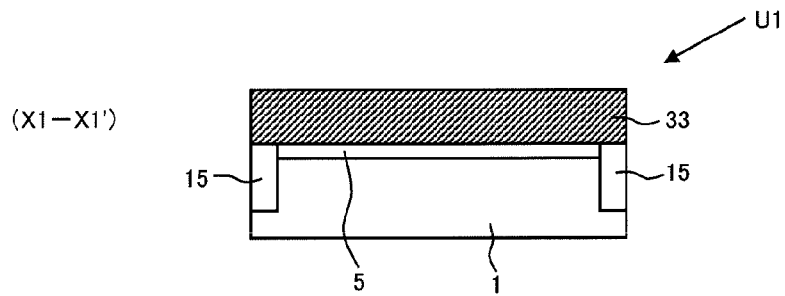
FIG. 8 is a process cross-sectional view schematically showing a cross-sectional structure in a step 4 of a method for producing the memory cell used in the nonvolatile semiconductor memory device according to the present invention.
Figure 8B:
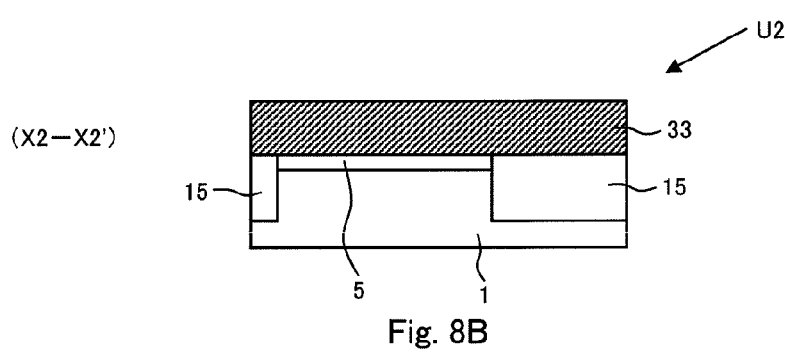
Figure 8C:
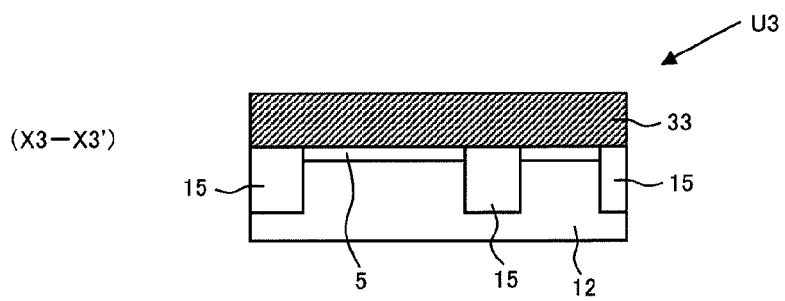
Figure 8D:
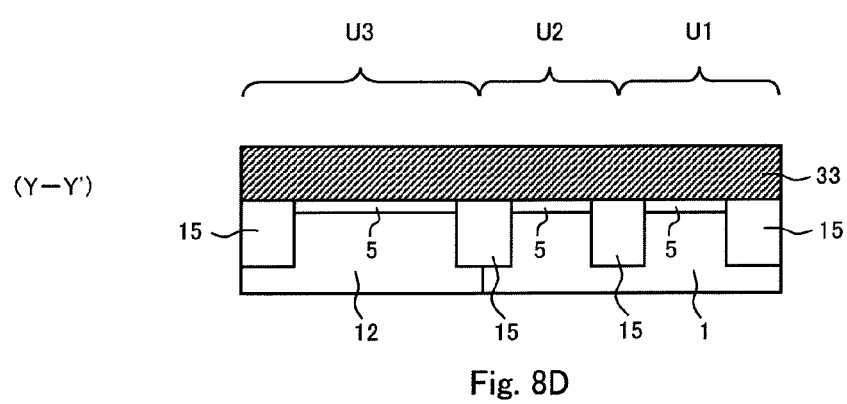
Figure 9A:
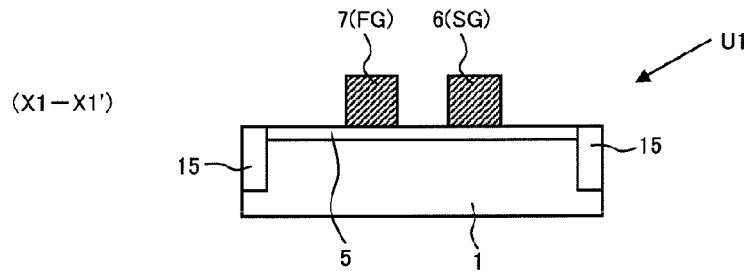
FIG. 9 is a process cross-sectional view schematically showing a cross-sectional structure in a step 5 of a method for producing the memory cell used in the nonvolatile semiconductor memory device according to the present invention.
Figure 9B:
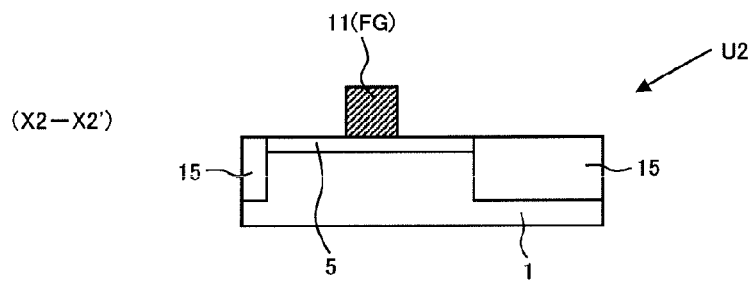
Figure 9C:
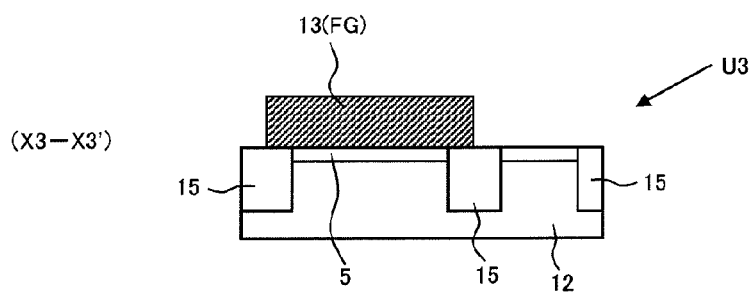
Figure 9D:
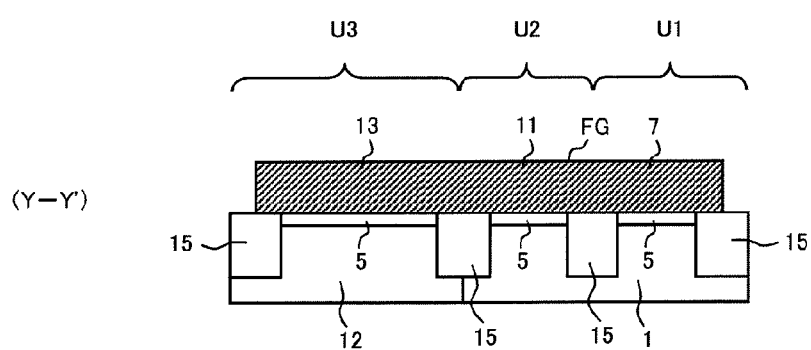
Figure 10A:
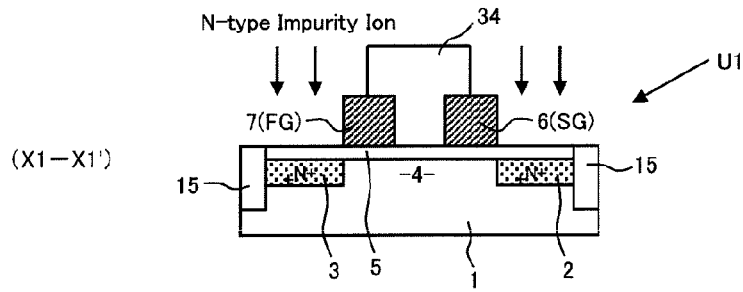
FIG. 10 is a process cross-sectional view schematically showing a cross-sectional structure in a step 6 of a method for producing the memory cell used in the nonvolatile semiconductor memory device according to the present invention.
Figure 10B:
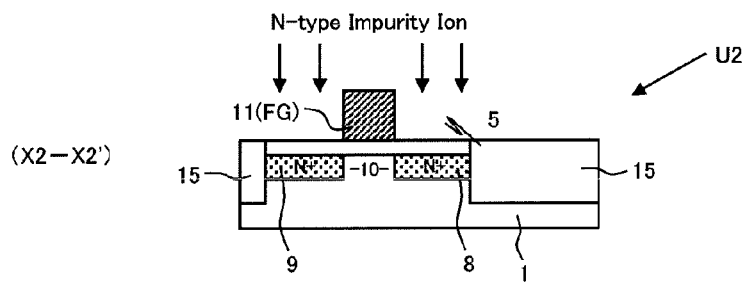
Figure 10C:
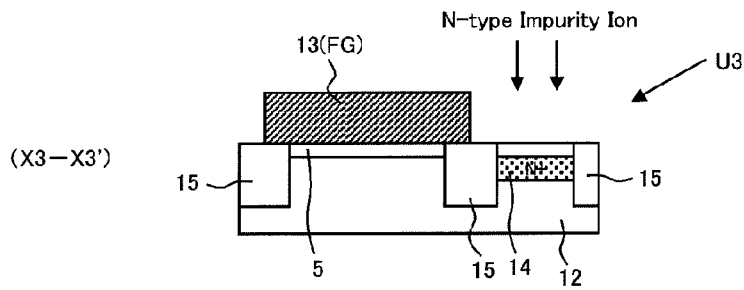
Figure 10D:
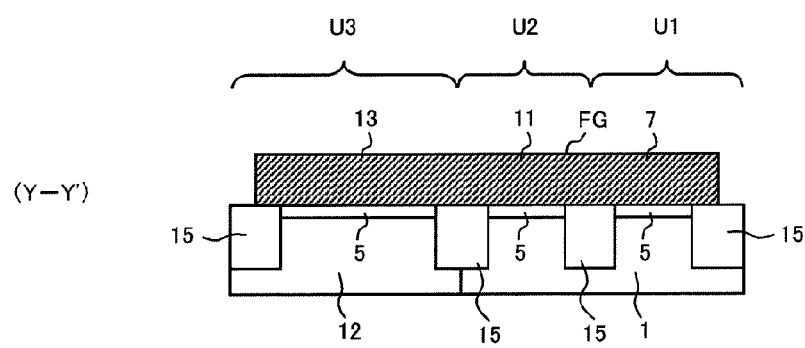
Figure 11A:
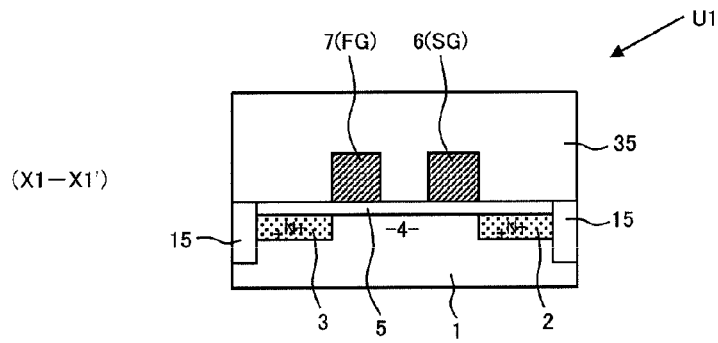
FIG. 11 is a process cross-sectional view schematically showing a cross-sectional structure in a step 7 of a method for producing the memory cell used in the nonvolatile semiconductor memory device according to the present invention.
Figure 11B:
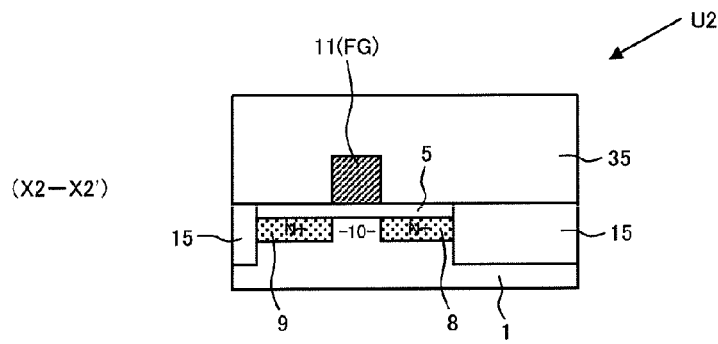
Figure 11C:
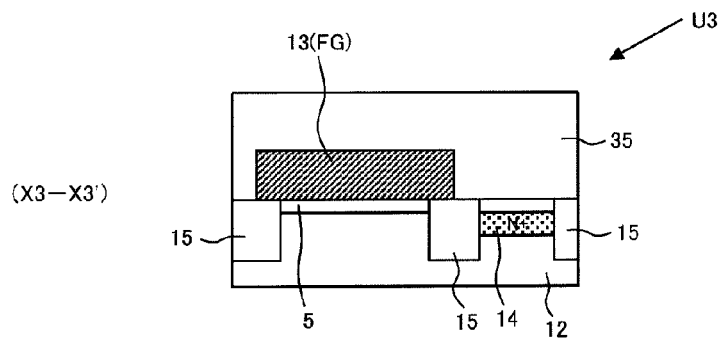
Figure 11D:
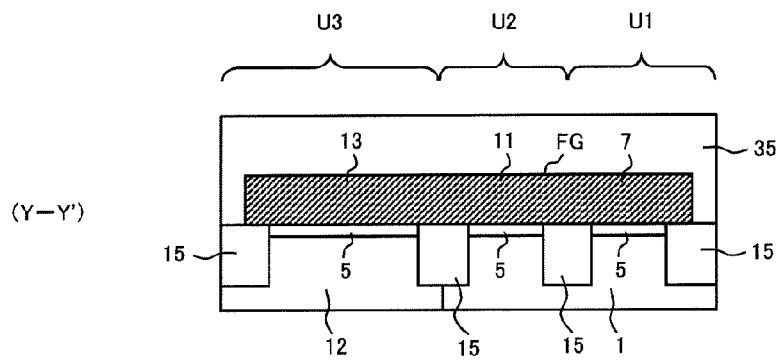
Figure 12A:
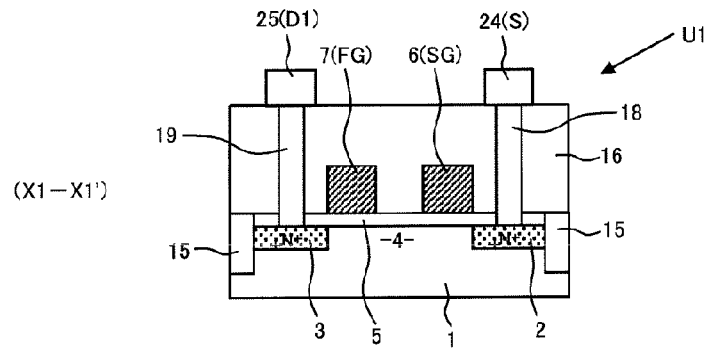
FIG. 12 is a process cross-sectional view schematically showing a cross-sectional structure in a step 8 of a method for producing the memory cell used in the nonvolatile semiconductor memory device according to the present invention.
Figure 12B:
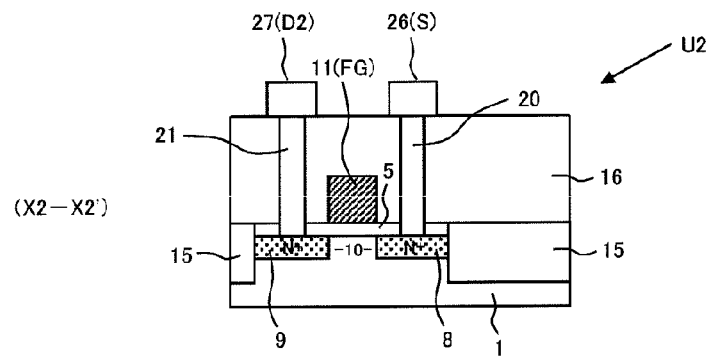
Figure 12C:
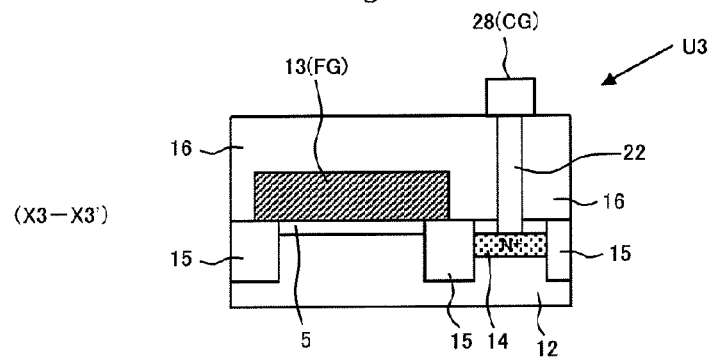
Figure 12D:
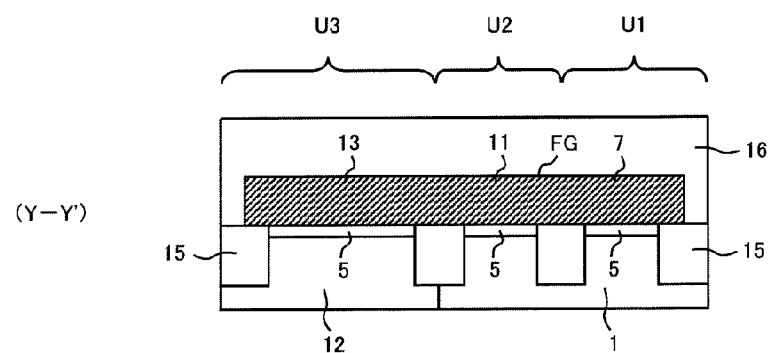
Figure 13:
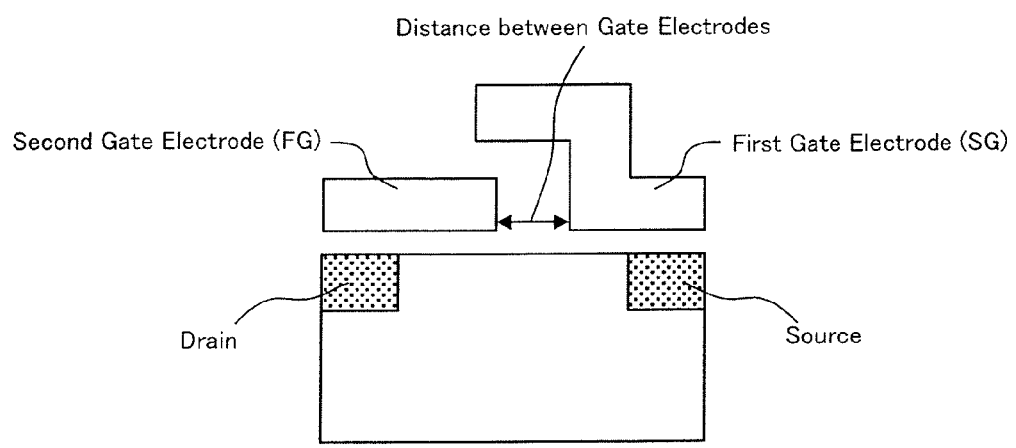
FIG. 13 is a cross-sectional view schematically showing a cross-sectional structure of a nonvolatile memory cell of a split-gate structure using two polysilicon layers.

Next, as for the nonvolatile semiconductor memory device according to the present invention, a description will be made of its characteristic structure of a memory cell, procedure and principle of a memory operation, and production method, with reference to the drawings.
Memory Cell Structure As shown in FIG. 1, a memory cell used in a nonvolatile semiconductor memory device according to a first embodiment of the present invention (hereinafter, referred to as "this memory cell") is mainly composed of three memory cell units such as a first memory cell unit U1, a second memory cell unit U2, and a third memory cell unit U3. FIG. 1 is a plan view schematically showing a planar structure of this memory cell, FIG. 2A is a cross-sectional view schematically showing a cross-sectional structure of this memory cell taken along a line X1-X1' in FIG. 1, FIG. 2B is a cross-sectional view schematically showing a cross-sectional structure of this memory cell taken along a line X2-X2' in FIG. 1, FIG. 2C is a cross-sectional view schematically showing a cross-sectional structure of this memory cell taken along a line X3-X3' in FIG. 1, and FIG. 2D is a cross-sectional view schematically showing a cross-sectional structure of this memory cell taken along a line Y-Y' in FIG. 1. In addition, FIG. 3 is an equivalent circuit diagram of this memory cell.

As shown in FIG. 1 and FIGS. 2A and 2D, the first memory cell unit U1 is an n-channel MOS transistor having a split-gate structure, and composed of a source region 2 (corresponding to a first diffusion region) and a drain region 3 (corresponding to a second diffusion region) which are n-type impurity diffusion layers formed on a surface of a p-type semiconductor substrate (p-type well) 1, and a first gate electrode 6 adjacent to the source region 2 and a second gate electrode 7 adjacent to the drain region 3 which are formed on a first channel region 4 provided between the source and drain regions 2 and 3 with a gate oxide film 5 interposed therebetween, so as to be separated to each other in a separation direction of the source and drain regions 2 and 3 (X direction in FIG. 1).

As shown in FIG. 1 and FIGS. 2B and 2D, the second memory cell unit U2 is an n-channel MOS transistor having a single-gate structure, and composed of a source region 8 (corresponding to a third diffusion region) and a drain region 9 (corresponding to a fourth diffusion region) which are the n-type impurity diffusion layers formed on the surface of the p-type semiconductor substrate (p-type well) 1, and a third gate electrode 11 formed on a second channel region 10 provided between the source and drain regions 8 and 9 with the gate oxide film 5 interposed therebetween.

As shown in FIG. 1, and FIGS. 2C and 2D, the third memory cell unit U3 is a MOS capacitor composed of a fourth gate electrode 13 formed on a surface of an n-type well 12 (corresponding to a second semiconductor substrate) formed separately from the p-type well 1 in a planar view, with the gate oxide film 5 interposed therebetween, and a contact region 14 which is an n-type impurity diffusion layer formed on the surface of the n-type well 12 and having a concentration higher than that of the n-type well 12.

A first active region composed of the source and drain regions 2 and 3 and the first channel region 4 in the first memory cell unit U1, a second active region composed of the source and drain regions 8 and 9 and the second channel region 10 in the second memory cell unit U2, and the n-type well 12 under the fourth gate electrode 13 and the contact region 14 in the third memory cell unit U3 are each surrounded by an element isolation region (field oxide film) 15, and the first and second active regions, and the n-type well 12 are electrically separated by the element isolation region 15.

The first to fourth gate electrodes 6, 7, 11, and 13 are formed of the same polysilicon film, and the second to fourth gate electrodes 7, 11, and 13 are processed to be one gate electrode pattern, and integrally formed, and electrically connected to one another to form a floating gate FG. In addition, the first gate electrode 6 has a function to activate and select the first memory cell unit U1 at the time of programming, as a subsidiary gate SG of the n-channel MOS transistor of the sprit-gate structure in the first memory cell unit U1.

The gate oxide film 5 of the respective memory cell units U1 to U3 has the same film thickness which is the same (such as 80 nm) as that of a gate oxide film of an MOS transistor used in a logic circuit (including a circuit to drive this memory cell) formed in the vicinity of this memory cell. In addition, a distance between the first and second gate electrodes 6 and 7 of the split-gate structure in the first memory cell unit U1 is defined by processing accuracy of the aforementioned polysilicon film, which is 90 nm, for example.

An interlayer insulation film 16 is deposited over the gate electrodes of the respective memory cell units U1 to U3, and contact materials 17 to 22 are formed in contact holes penetrating the interlayer insulation film 16 so as to connect the first gate electrode 6, the source and drain regions 2 and 3 in the first memory cell unit U1, the source and drain regions 8 and 9 in the second memory cell unit U2, and the contact region 14 in the third memory cell unit U3, to metal electrodes 24 to 28 on the interlayer insulation film 16, respectively. In addition, although the metal electrodes 24 to 28 are not shown in FIG. 1, the metal electrodes 24 and 26 which are connected to the source region 2 in the first memory cell unit U1, and the source region 8 in the second memory cell unit U2, respectively are electrically connected by a metal wiring on the interlayer insulation film 16 and serve as a common source electrode S in both of the memory cell units U1 and U2.

The metal electrode 28 is electrically connected to the n-type well 12 through the contact region 14, and capacitively coupled to the fourth gate electrode 13 (floating gate FG) through the gate oxide film 5 on the n-type well 12, and thus capacitively coupled to the respective floating gates FG of the n-channel MOS transistor of the split-gate structure in the first memory cell unit U1, and the n-channel MOS transistor of the single-gate structure in the second memory cell unit U2, and functions as a control gate CG to control a potential of each of the floating gates FG.

In addition, the metal electrode (not shown) is connected to the first gate electrode 6 and functions as the subsidiary gate SG as described above, and the metal electrode 25 is connected to the drain region 3 of the n-channel MOS transistor of the split-gate structure in the first memory cell unit U1 and functions as a drain electrode D1 at the time of programming and erasing operations, and the metal electrode 27 is connected to the drain region 9 of the n-channel MOS transistor of the single-gate structure in the second memory cell unit U2 and functions as a drain electrode D2 at the time of reading operation.

Procedure and Principle of Memory Operation

Next, a description will be made of an operation procedure and an operation principle of memory operations at the time of programming, erasing, and reading of this memory cell, with reference to FIGS. 1 to 4. FIG. 4 is a list showing voltage application conditions to respective electrodes of this memory cell in each of the memory operations.

1. Programming Operation

As shown in FIG. 4, at the time of programming, by grounding the source electrode S, and applying a high voltage (+5 V, for example) to the drain electrode D1, and applying a high voltage (+10 V, for example) to the control gate CG, a potential rises in the second gate electrode 7 (floating gate FG) which is capacitively coupled to the control gate CG through the MOS capacitor in the third memory cell unit U3 to put a part just under the second gate electrode 7 of the first channel region 4 into a strongly-inverted state, and the strongly inverted region serves as an extension region of the drain region 3. In this state, when a voltage about a threshold voltage Vth (+0.8 V), for example of the first gate electrode 6 is applied to the subsidiary gate SG, hot electrons are injected from the source region 2 to the second gate electrode 7 (floating gate FG) through the part just under the first gate electrode 6 of the converted first channel region 4, whereby the programming is performed by the source-side injection. Thus, an amount of the electrons accumulated in the floating gate FG increases, and a threshold voltage of the MOS transistor in the second memory cell unit U2 used for the reading operation rises. In addition, at the time of programming, the MOS transistor in the second memory cell unit U2 is not used, so that the drain electrode D2 is grounded to avoid unnecessary current consumption.

2. Erasing Operation

As shown in FIG. 4, at the time of erasing, by grounding the control gate CG and the subsidiary gate SG to put the source electrode S into a floating state, and applying a high voltage (+10 V, for example) to the drain electrode D1, a high potential difference is generated between the drain electrode D1 and the second gate electrode 7 due to capacitive division among the control gate CG, the second gate electrode 7 (floating gate FG), and the drain electrode D1, so that electrons accumulated in the floating gate FG are drawn from the floating gate FG to the drain electrode D1 due to a current caused by a FN (Fawler-Nordheim) tunneling phenomenon, or a band-to-band tunneling phenomenon. As a result, the accumulated amount of the electrons decreases in the floating gate FG, and a threshold voltage of the MOS transistor in the second memory cell unit U2 for the reading operation decreases. In addition, since the MOS transistor in the second memory cell unit U2 is not used at the time of erasing, the drain electrode D2 is grounded or put into the floating state to avoid unnecessary current consumption.

3. Reading Operation

At the time of reading operation, the MOS transistor in the second memory cell unit U2 is used, and the MOS transistor of the split-gate structure in the first memory cell unit U1 is not used. As shown in FIG. 4, at the time of reading, by grounding the source electrode S, and applying a reading gate voltage (a power supply voltage Vcc of the peripheral circuit such as +3 V) higher than a threshold voltage seen from the control gate CG based on the source electrode S when the MOS transistor in the second memory cell unit U2 is in an erased state, to the control gate CG, and applying a reading drain voltage (such as +1 V) to the drain electrode D2, a difference in electron accumulated amount in the floating gate FG is determined by a current amount flowing from the drain electrode D2 to the source electrode S, so that whether a programmed state or erased state is determined. More specifically, in a programmed state, the above current amount is small (or a current does not flow) because the threshold voltage is high, while in the erased state, the above current amount is large because the threshold voltage is low, so that whether the programmed state or the erased state can be determined by comparing the two current amounts with a reference value having a middle value of the two current amounts.

In addition, the voltages applied to respective electrodes in the respective memory operations are generated by the peripheral circuit of this memory cell, and the circuit to generate and control the applied voltage value for each memory operation may have the well-known circuit configuration in the conventional nonvolatile semiconductor memory device having the memory cell of the split-gate structure. Since the circuit configuration is not characteristic part of the present invention, its detailed description is omitted.

Production Method

Next, a method for producing this memory cell will be described with reference to FIGS. 5 to 12. FIGS. 5 to 12 are process cross-sectional views schematically showing cross-sectional structures of this memory cell in a step 1 to a step 8 to produce this memory cell, in which A to D in each figure schematically show a cross-section taken along a line X1-X1' in FIG. 1, a cross-section taken along a line X2-X2' in FIG. 1, a cross-section taken along a line X3-X3' in FIG. 1, and a cross-section taken along a line Y-Y' in FIG. 1, respectively. The method for producing this memory cell is roughly divided into eight steps (step 1 to step 8) in the following description. In addition, the steps 1 to 8 comply with the normal silicon semiconductor production process (one-layer polysilicon CMOS process), so that as for detailed production conditions such as an ion implantation condition, a film forming condition, and an etching condition, appropriate condition may be used, and those are not described in this embodiment.

First, in the step 1 shown in FIG. 5, a semiconductor substrate 30 having a predetermined conductivity type (p type, n type, or intrinsic type) is etched with a predetermined pattern to form grooves, and the groove is filled with a silicon oxide film, whereby the element isolation region 15 is formed. The regions for the memory cell units U1 to U3 are defined by the element isolation regions 15. In addition, while a sacrifice oxide film is formed on a surface of the semiconductor substrate 30 in the active region surrounded by the element isolation region 15 in FIG. 5, a detailed description for further refined step of the steps 1 to 8 is omitted in order to simplify the description.

Then, in the step 2 shown in FIG. 6, a resist pattern 31 to mask the region for the third memory cell unit U3 is formed on the semiconductor substrate 30 by the photolithography technique, and a p-type impurity ions are implanted to form the p-type semiconductor substrate (p-type well) 1 in the respective regions of the first and second memory cell units U1 and U2. At this time, a p-type well is formed in a region of an n-channel MOS transistor of the peripheral circuit at the same time.

Then, in the step 3 shown in FIG. 7, a resist pattern 32 to mask the regions for the first and second memory cell units U1 and U2 is formed on the p-type well 1 by the photolithography technique, and an n-type impurity ions are implanted in the semiconductor substrate 30 in which the p-type well 1 is not formed, to form the n-type well 12 in the region for the third memory cell unit U3. At this time, an n-type well is formed in a region of a p-channel MOS transistor of the peripheral circuit at the same time.

Then, in the step 4 shown in FIG. 8, the gate oxide film 5 is formed on the surfaces of the p-type well 1 and the n-type well 12 by thermal oxidation, and a polysilicon film 33 which becomes the first to fourth gate electrodes 6, 7, 11, and 13 is deposited on a whole surface.

Then, in the step 5 shown in FIG. 9, a resist pattern (not shown) of the gate electrode pattern is formed on the polysilicon film 31 by the photolithography technique, and then the polysilicon film 31 which is not covered with the resist pattern is etched away, to form the respective first to fourth gate electrodes 6, 7, 11, and 13. As a result, the first and second gate electrodes 6 and 7 are formed in the region for the first memory cell unit U1, the third gate electrode 11 is formed in the region for the second memory cell unit U2, and the fourth gate electrode 13 is formed in the region for the third memory cell unit U3. In addition, as shown in FIG. 8, the second to fourth gate electrodes 7, 11, and 13 are processed to be the one gate electrode pattern, and the integrated floating gate FG is formed.

Then, in the step 6 shown in FIG. 10, a resist pattern 34 to mask the space between the first and second gate electrodes 6 and 7 in the first memory cell unit U1, and the region of the p-channel MOS transistor of the peripheral circuit is formed by the photolithography technique, and an n-type impurity ions are implanted to form the source and drain regions 2 and 3 in the first memory cell unit U1, the source and drain regions 8 and 9 in the second memory cell unit U2, and the contact region 14 in the third memory cell unit U3. At this time, source and drain regions of the n-channel MOS transistor of the peripheral circuit are formed at the same time.

Then, in the step 7 shown in FIG. 11, a resist pattern 35 to mask the regions for the first to third memory cell units U1 to U3, and the region for the n-channel MOS transistor of the peripheral circuit is formed by the photolithography technique, and p-type impurity ions are implanted to form source and drain regions of the p-channel MOS transistor of the peripheral circuit. In addition, when it is not necessary to form the p-channel MOS transistor of the peripheral circuit, the step 7 is omitted.

Then, in the step 8 shown in FIG. 12, the interlayer insulation film 16 is deposited and then, the contact holes are formed and filled with the contact materials 17 to 22, and the metal wiring including the metal electrodes 24 to 28 are formed according to the normal silicon semiconductor production process steps, whereby the nonvolatile semiconductor memory device having this memory cell is formed.

The configuration may not have the second memory cell unit U2.

Second Embodiment

Figure 14:
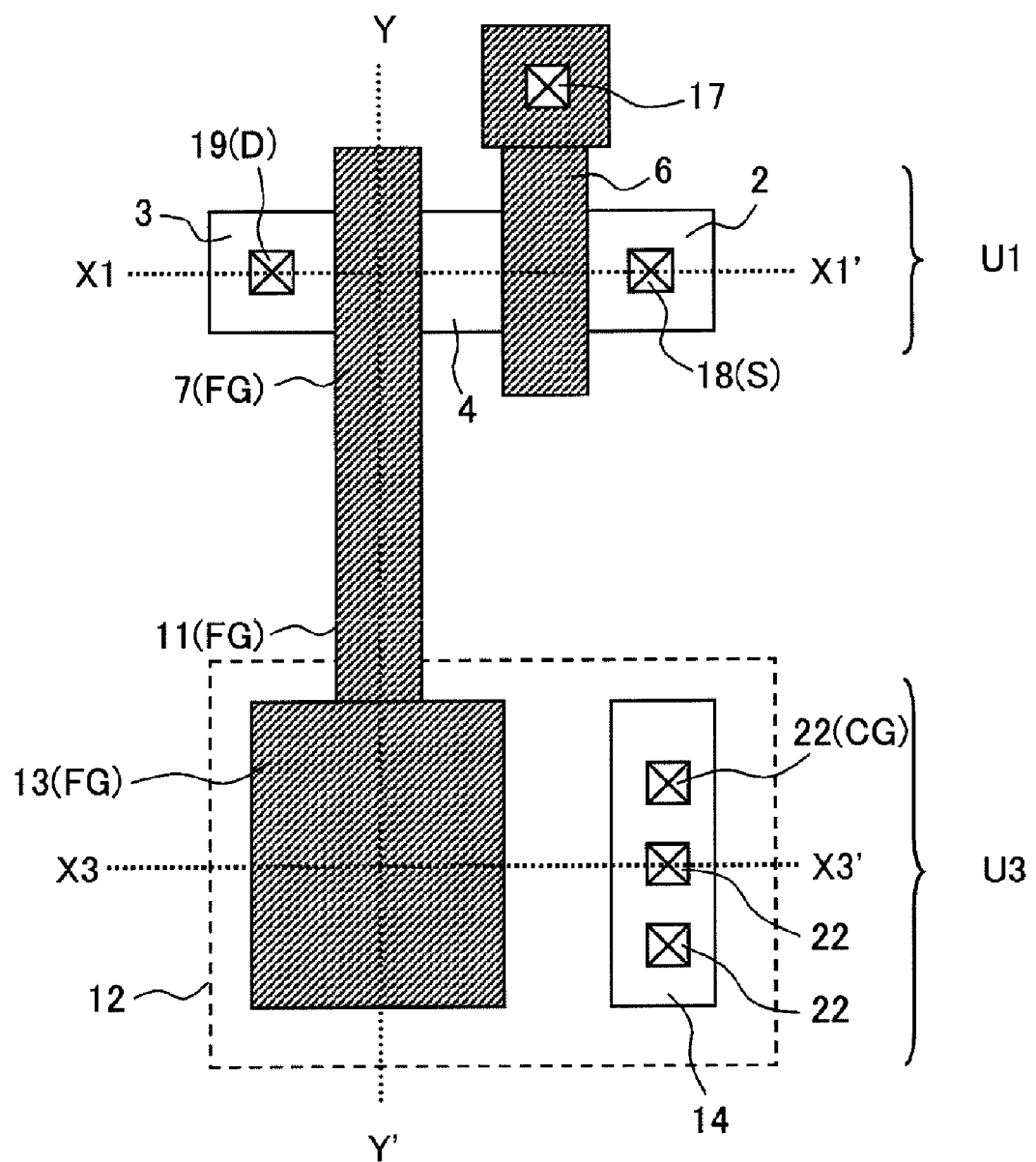
FIG. 14 is a plan view schematically showing a planar structure of the memory cell used in the nonvolatile semiconductor memory device according to the present invention.
Figure 15A:
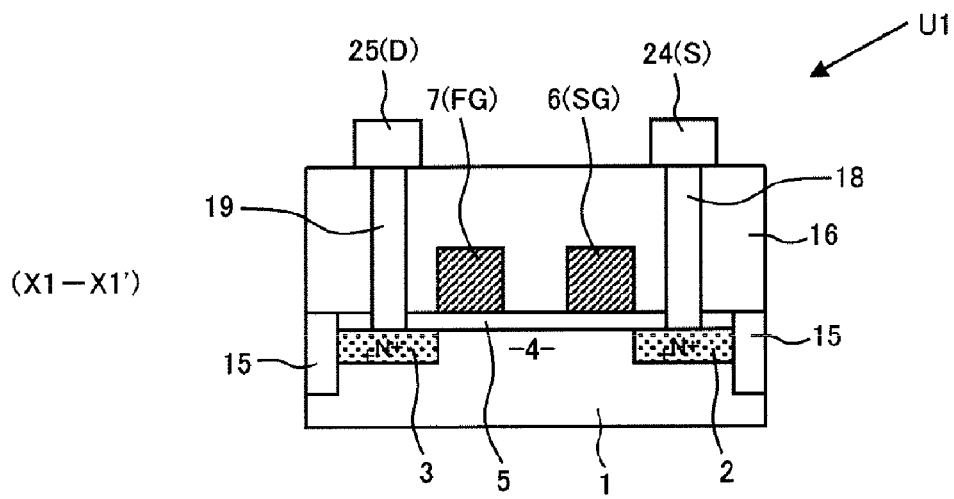
FIG. 15 is a cross-sectional view schematically showing a cross-sectional structure of the memory cell used in the nonvolatile semiconductor memory device according to the present invention.
Figure 15B:
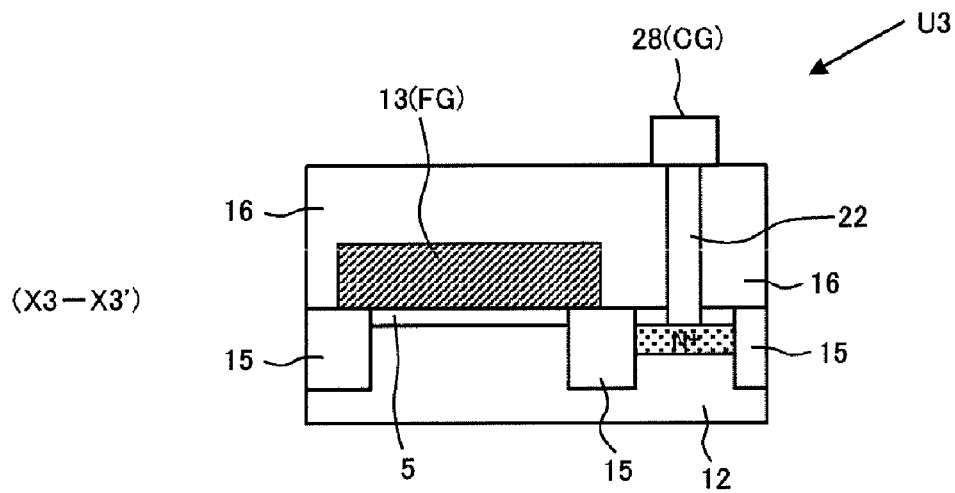
Figure 15C:
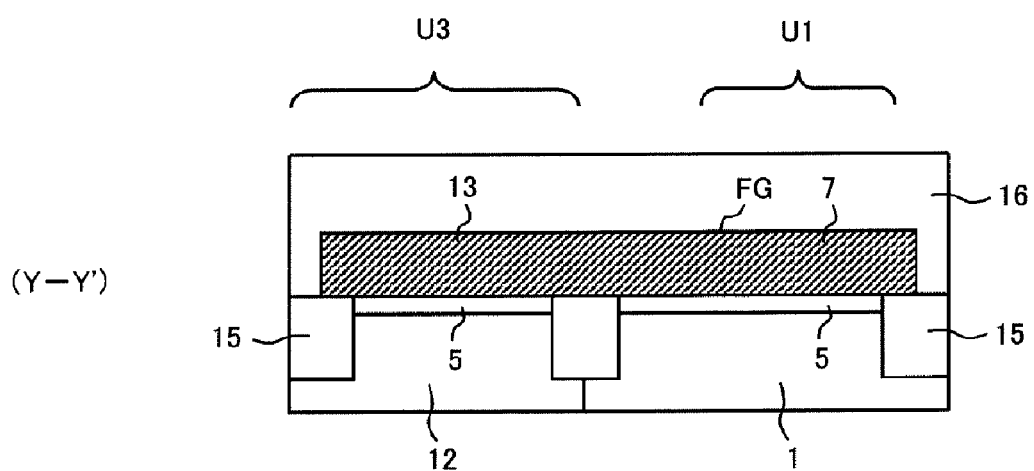
Figure 16:
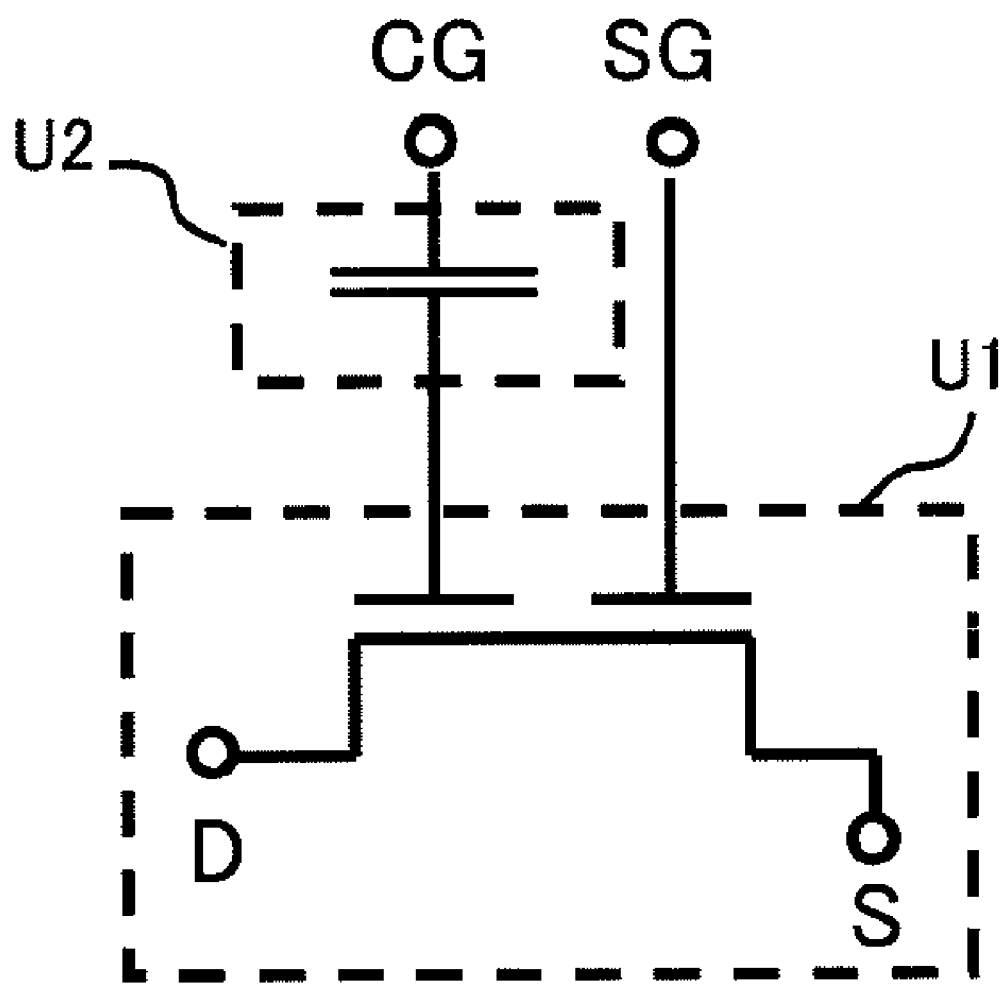
FIG. 16 is an equivalent circuit diagram of the memory cell used in the nonvolatile semiconductor memory device according to the present invention.

As shown in FIG. 14, a memory cell used in a nonvolatile semiconductor memory device according to a second embodiment of the present invention (hereinafter, referred to as "this memory cell") is roughly composed of two memory cell units such as a first memory cell unit U1 and a third memory cell unit U3. FIG. 14 is a plan view schematically showing a planar structure of this memory cell, FIG. 15A is a cross-sectional view schematically showing a cross-sectional structure of this memory cell taken along a line X1-X1' in FIG. 14, FIG. 15B is a cross-sectional view schematically showing a cross-sectional structure of this memory cell taken along a line X3-X3' in FIG. 14, and FIG. 15C is a cross-sectional view schematically showing a cross-sectional structure of this memory cell taken along a line Y-Y' in FIG. 14. In addition, FIG. 16 is an equivalent circuit diagram of this memory cell. Since the configurations of the first memory cell unit U1 and the third memory cell unit U3 are completely the same as those in the first embodiment, their descriptions are omitted. A gate oxide film 5 of the respective first memory cell unit U1 and the third memory cell unit U3 has the same film thickness as a gate oxide film (such as 80 nm) of a MOS transistor used in a logic circuit (including a circuit to drive this memory cell) formed in the vicinity of this memory cell. In addition, a distance between first and second gate electrodes 6 and 7 of a split-gate structure in the first memory cell unit U1 is defined by a process accuracy of a polysilicon film serving as a gate electrode material layer, and it is 90 nm, for example. A metal electrode 25 is connected to a drain region 3 of an n-channel MOS transistor of a split-gate structure in the first memory cell unit U1, and functions as a common drain electrode D at both programming/erasing operation and reading operation.

Next, a description will be made of an operation procedure and an operation principle of memory operations at the time of programming, erasing, and reading of this memory cell, with reference to FIGS. 14 to 17. FIG. 17 is a list showing voltage application conditions to respective electrodes of this memory cell in each memory operation.

1. Programming Operation

As shown in FIG. 17, at the time of programming, by grounding a source electrode S, and applying a high voltage (+5 V, for example) to the drain electrode D, and applying a high voltage (+10 V, for example) to a control gate CG, a potential rises in the second gate electrode 7 (floating gate FG) which is capacitively coupled to the control gate CG through a MOS capacitor in the third memory cell unit U3 to put a part just under the second gate electrode 7 of a first channel region 4 into a strongly-inverted state, and the strongly inverted region serves as an extension region of the drain region 3. In this state, when a voltage about a threshold voltage Vth (+0.8 V, for example) of the first gate electrode 6 is applied to a subsidiary gate SG, hot electrons are injected from a source region 2 to the second gate electrode 7 (floating gate FG) through the part just under the first gate electrode 6 of the converted first channel region 4, whereby the programming is performed by the source-side injection. Thus, an amount of the electrons accumulated in the floating gate FG increases, and a threshold voltage of the MOS transistor in the first memory cell unit U1 rises.

2. Erasing Operation

As shown in FIG. 17, at the time of erasing, by grounding the control gate CG and the subsidiary gate SG to put the source electrode S into a floating state, and applying a high voltage (+10 V, for example) to the drain electrode D, a high potential difference is generated between the drain electrode D and the second gate electrode 7 due to capacitive division among the control gate CG, the second gate electrode 7 (floating gate FG), and the drain electrode D, so that electrons accumulated in the floating gate FG are drawn from the floating gate FG to the drain electrode D by a current caused by a FN (Fawler-Nordheim) tunneling phenomenon, or a band-to-band tunneling phenomenon. As a result, the accumulated amount of the electrons decreases in the floating gate FG, and a threshold voltage of the MOS transistor in the first memory cell unit U1 decreases.

3. Reading Operation

As shown in FIG. 17, at the time of reading operation, by grounding the source electrode S, and applying a reading gate voltage (a power supply voltage Vcc of the peripheral circuit such as +3 V) higher than a threshold voltage seen from the control gate CG based on the source electrode S of the MOS transistor in the first memory cell unit U1, to the control gate CG, and applying a reading drain voltage (such as +1 V) to the drain electrode D, a difference in electron accumulated amount in the floating gate FG is determined by a current amount flowing from the drain electrode D to the source electrode S, so that whether a programmed state or erased state is determined. More specifically, in a programmed state, the above current amount is small (or a current does not flow) because the threshold voltage is high, while in the erased state, the above current amount is large because the threshold voltage is low, so that whether the programmed state or the erased state can be determined by comparing the two current amounts with a reference value having a middle value of the two current amounts.

In addition, the voltages applied to respective electrodes in the respective memory operations are generated by the peripheral circuit of this memory cell, and the circuit to generate and control the applied voltage value for each memory operation may have the well-known conventional circuit configuration in the conventional nonvolatile semiconductor memory device having the memory cell of the split-gate structure. Since the circuit configuration is not characteristic part of the present invention, its detailed description is omitted.

As for a method for producing this memory cell, the part for producing the second memory cell unit U2 is to be omitted from the steps for producing the memory cell according to the first embodiment shown in FIGS. 5 to 12.

Other Embodiments

Hereinafter, other embodiment of this memory cell will be described.

(1) While the MOS capacitor formed in the third memory cell unit U3 is used as the capacitor for the capacitive coupling between the floating gate FG and the control gate CG in the above embodiments, the capacitor for the capacitive coupling is not limited to the MOS capacitor, and it may be formed between the gate electrode material layer (polysilicon film) composing the floating gate FG and another wiring layer.

(2) While the MOS capacitor in the third memory cell unit U3 is formed on the n-type well 12 in the above embodiments, it may be formed on another independent p-type well as long as it can be electrically isolated from the p-type well 1 in which the first and second memory cell units U1 and U2 are formed. For example, when the p-type well and the n-type well are formed on an insulator substrate, the p-type well in the third memory cell unit U3 and the p-type well 1 in the first and second memory cell units U1 and U2 can be electrically isolated from each other by the element isolation region 15.

(3) While the source regions 2 and 8 of the MOS transistors in the first and second memory cell units U1 and U2 are electrically connected through the metal electrodes 24 and 26 in the first embodiment, the source regions 2 and 8 may be separated into the first source electrode and the second source electrode without electrically connecting the metal electrodes 24 and 26.

In addition, instead of electrically connecting the source regions 2 and 8 of the MOS transistors in the respective first and second memory cell units U1 and U2 like in the first embodiment, the source region 2 in the first memory cell unit U1 and the drain region 9 in the second memory cell unit U2 may be electrically connected. In this case, the relationship between the source and the drain of the memory cell is only reversed between the programming time and the reading time.

(4) While the memory cell structure, memory operations, and production method of a single memory cell have been described in the above embodiments, when a memory cell array is composed by arranging the memory cells, a memory cell structure, a memory operation and a production method of the memory cell array are the same as described above. As for the memory operation, it is necessary to select the memory cell as a memory operation target from the memory cell array and apply voltages shown in FIG. 4 or FIG. 17 to respective electrodes in the selected memory cell but not apply the voltages to the unselected memory cells. The selection/non-selection of memory cell may be treated similarly to the conventional nonvolatile semiconductor memory device having the nonvolatile memory cell of the split-gate structure.

(5) While the n-type impurity is implanted in the first and second diffusion regions to form the first memory cell unit U1 as the n-channel MOS transistor in the above embodiments, a p-type impurity may be implanted in the n-well to form a p-channel MOS transistor. However, in this case, it is necessary to electrically isolate the MOS capacitor in the third memory cell unit U3 from the first memory cell unit U1 by forming the MOS capacitor on the p-type semiconductor substrate or the p-well.

(6) It is preferable to form a diffusion region having the same conductivity type (p type) as the semiconductor substrate, in a position sandwiched between the first and second gate electrodes between the source region and the drain region in the first memory cell unit U1. In this case, programming efficiency is prevented from being lowered due to miniaturization of the space between the gates. The above diffusion region may be formed by ion implantation of a p-type impurity, with a resist mask having an opening in a part between the source region and the drain region in the first memory cell unit U1, in the step 7 shown in FIG. 11 in the production steps in the first embodiment.

INDUSTRIAL APPLICABILITY

The present invention can be applied to a nonvolatile semiconductor memory device having a source-side injection type of nonvolatile memory cell in which a charge injection is performed from a source to a floating gate of a transistor of the memory cell, and especially to a nonvolatile semiconductor memory device in which a logic circuit is consolidated on the same semiconductor substrate.

The invention claimed is:

1. A nonvolatile semiconductor memory device comprising a nonvolatile memory cell of a split-gate structure having a floating gate, wherein the memory cell comprises:
a first memory cell unit including a first diffusion region, a second diffusion region, a first gate electrode adjacent to the first diffusion region, and a second gate electrode adjacent to the second diffusion region, the first diffusion region and the second diffusion region being formed on a surface of a first semiconductor substrate, the first gate electrode and the second gate electrode being formed on a first channel region between the first diffusion region and the second diffusion region through a gate insulation film so as to be separated in a direction from the first diffusion region to the second diffusion region, a conductivity type of a region, including the first channel region, under a space between the first and second gate electrodes on the surface of the first semiconductor substrate being same as that of the first semiconductor substrate;

a second memory cell unit including a third diffusion region, a fourth diffusion region, and a third gate electrode, the third diffusion region and the fourth diffusion region being formed on the surface of the first semiconductor substrate, the third gate electrode being formed on a second channel region between the third diffusion region and the fourth diffusion region through a gate insulation film; and a control terminal, the first gate electrode, the second gate electrode, and the third gate electrode are formed of a same electrode material layer, the second gate electrode and the third gate electrode are electrically connected to form the floating gate, and the floating gate is capacitively coupled to the control terminal.

2. The nonvolatile semiconductor memory device according to claim 1, wherein the second gate electrode and the third gate electrode are integrally formed.

3. The nonvolatile semiconductor memory device according to claim 1, wherein a fourth gate electrode is formed of the electrode material layer on a surface of a second semiconductor substrate through a gate insulation film, the second semiconductor substrate having a conductivity type opposite to that of the first semiconductor substrate, or electrically isolated from the first semiconductor substrate, the fourth gate electrode is electrically connected to each of the second gate electrode and the third gate electrode, and the second semiconductor substrate is electrically connected to the control terminal.

4. The nonvolatile semiconductor memory device according to claim 3, wherein the second gate electrode, the third gate electrode, and the fourth gate electrode are integrally formed.

5. The nonvolatile semiconductor memory device according to claim 3, wherein the first diffusion region is electrically connected to one of the third diffusion region and the fourth diffusion region.

6. The nonvolatile semiconductor memory device according to claim 3, wherein a fifth diffusion region having the same conductivity type as that of the first semiconductor substrate is formed in the first channel region on the surface of the first semiconductor substrate between the first gate electrode and the second gate electrode.

7. The nonvolatile semiconductor memory device according to claim 1, wherein the first diffusion region is electrically connected to one of the third diffusion region and the fourth diffusion region.

8. The nonvolatile semiconductor memory device according to claim 1, wherein a fifth diffusion region having the same conductivity type as that of the first semiconductor substrate is formed in the first channel region on the surface of the first semiconductor substrate between the first gate electrode and the second gate electrode.

* * * * *